United States Patent
Liu et al.

(10) Patent No.: US 8,790,980 B2
(45) Date of Patent: Jul. 29, 2014

(54) IMPLANT DAMAGE CONTROL BY IN-SITU C DOPING DURING SIGE EPITAXY FOR DEVICE APPLICATIONS

(71) Applicants: GLOBALFOUNDRIES Singapore Pte. Ltd., Singapore (SG); International Business Machines Corporation, New York, NY (US)

(72) Inventors: Jin Ping Liu, Beacon, NY (US); Jundson Robert Holt, Wappingers Falls, NY (US)

(73) Assignees: International Business Machines Corporation (IBM); GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/182,242

(22) Filed: Feb. 17, 2014

(65) Prior Publication Data

US 2014/0159113 A1 Jun. 12, 2014

Related U.S. Application Data

(60) Division of application No. 13/113,107, filed on May 23, 2011, now Pat. No. 8,652,892, which is a continuation of application No. 11/502,132, filed on Aug. 9, 2006, now Pat. No. 7,947,546.

(60) Provisional application No. 60/732,354, filed on Oct. 31, 2005.

(51) Int. Cl.
H01L 21/336 (2006.01)

(52) U.S. Cl.
USPC ..... 438/285; 438/301; 438/508; 257/E21.431

(58) Field of Classification Search
USPC ............. 438/285, 301, 508; 257/E21.431
See application file for complete search history.

(56) References Cited

U.S. PATENT DOCUMENTS

| | | | |
|---|---|---|---|
| 6,153,920 A | 11/2000 | Gossmann et al. | |
| 6,190,975 B1 | 2/2001 | Kubo et al. | |
| 6,274,894 B1 | 8/2001 | Wieczorek et al. | |
| 6,326,664 B1 | 12/2001 | Chau et al. | |
| 6,492,216 B1 | 12/2002 | Yeo et al. | |
| 6,566,204 B1 | 5/2003 | Wang et al. | |
| 6,576,535 B2 | 6/2003 | Drobny et al. | |
| 6,667,216 B2 * | 12/2003 | Umimoto et al. | 438/329 |
| 6,797,556 B2 | 9/2004 | Murthy et al. | |
| 6,800,910 B2 | 10/2004 | Lin et al. | |
| 6,806,151 B2 | 10/2004 | Wasshuber et al. | |

(Continued)

OTHER PUBLICATIONS

J.P. Liu, et al., entitled: Impact of in situ carbon doping on implant damage and strain relaxation of epitaxial silicon germanium layer on silicon, Appl. Phys. Lett. 88, 151916 (2006) (3 pages), published online Apr. 13, 2006.

(Continued)

Primary Examiner — Trung Q Dang
(74) Attorney, Agent, or Firm — Horizon IP Pte. Ltd.

(57) ABSTRACT

Some example embodiments of the invention comprise methods for and semiconductor structures comprised of: a MOS transistor comprised of source/drain regions, a gate dielectric, a gate electrode, channel region; a carbon doped SiGe region that applies a stress on the channel region whereby the carbon doped SiGe region retains stress/strain on the channel region after subsequent heat processing.

20 Claims, 15 Drawing Sheets

(56) References Cited

U.S. PATENT DOCUMENTS

| | | |
|---|---|---|
| 6,831,350 B1 | 12/2004 | Liu et al. |
| 6,844,227 B2 | 1/2005 | Kubo et al. |
| 7,112,848 B2 | 9/2006 | Lee |
| 7,122,435 B2 | 10/2006 | Chidambaram et al. |
| 7,145,166 B2 | 12/2006 | Lee |
| 7,221,006 B2 | 5/2007 | Orlowski et al. |
| 7,268,049 B2 | 9/2007 | Zhu et al. |
| 7,279,430 B2 | 10/2007 | Chang et al. |
| 7,465,972 B2 | 12/2008 | Wang et al. |
| 7,807,538 B2 | 10/2010 | Yamauchi et al. |
| 7,947,546 B2 | 5/2011 | Liu et al. |
| 2002/0011617 A1 | 1/2002 | Kubo et al. |
| 2002/0033511 A1 | 3/2002 | Babcock et al. |
| 2004/0173815 A1 | 9/2004 | Yeo et al. |
| 2004/0262683 A1 | 12/2004 | Bohr et al. |
| 2004/0262694 A1 | 12/2004 | Chidambaram |
| 2005/0029601 A1 | 2/2005 | Chen et al. |
| 2005/0035369 A1 | 2/2005 | Lin et al. |
| 2005/0156169 A1 | 7/2005 | Chu |
| 2005/0285187 A1 | 12/2005 | Bryant et al. |
| 2006/0118878 A1 | 6/2006 | Huang et al. |
| 2006/0134872 A1 | 6/2006 | Hattendorf et al. |
| 2007/0093033 A1 | 4/2007 | Wang et al. |
| 2007/0117326 A1* | 5/2007 | Tan et al. .................. 438/266 |
| 2007/0132027 A1 | 6/2007 | Chidambaram |

OTHER PUBLICATIONS

M. Caymax, R. Loo ; Title High-mobility layers and advanced source/drain http://www.imec.be/wwwinter/mediacenter/en/SR2003/scientific_results/research_imec/2_1_cmos/2_1_3/2_1_3_2_4_cont.html On found on Website—Oct. 29, 2005.

Chung Foong Tan et al., Influence of substitutional carbon incorporation on implanted-indium-related defects and transient enhanced diffusion, Applied Physics Letters vol. 83, No. 20, Nov. 17, 2003, pp. 4169-4171.

Chidambaram et al. ("Fundamentals of Silicon Material Properties for Successful Exploitation of Strain Engineering in Modern CMOS Manufacturing", IEEE Transactions on Electron Devices. vol. 53. No. 5. May 2006).

Megson, T.H.G., "Structural and Stress Analysis". Elsevier Butterworth-Heinemann. Second Edition. 2005.

* cited by examiner

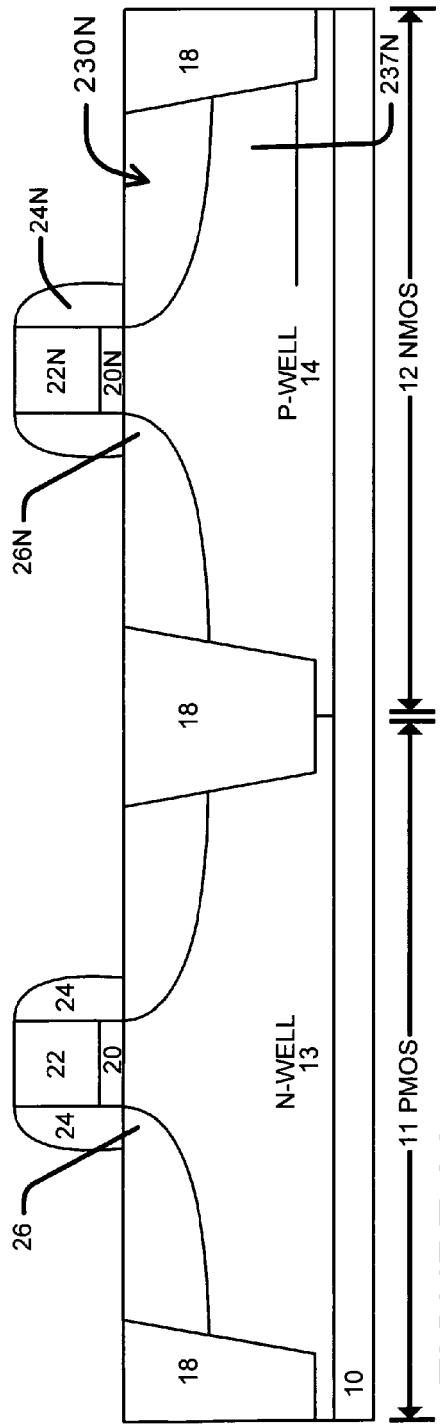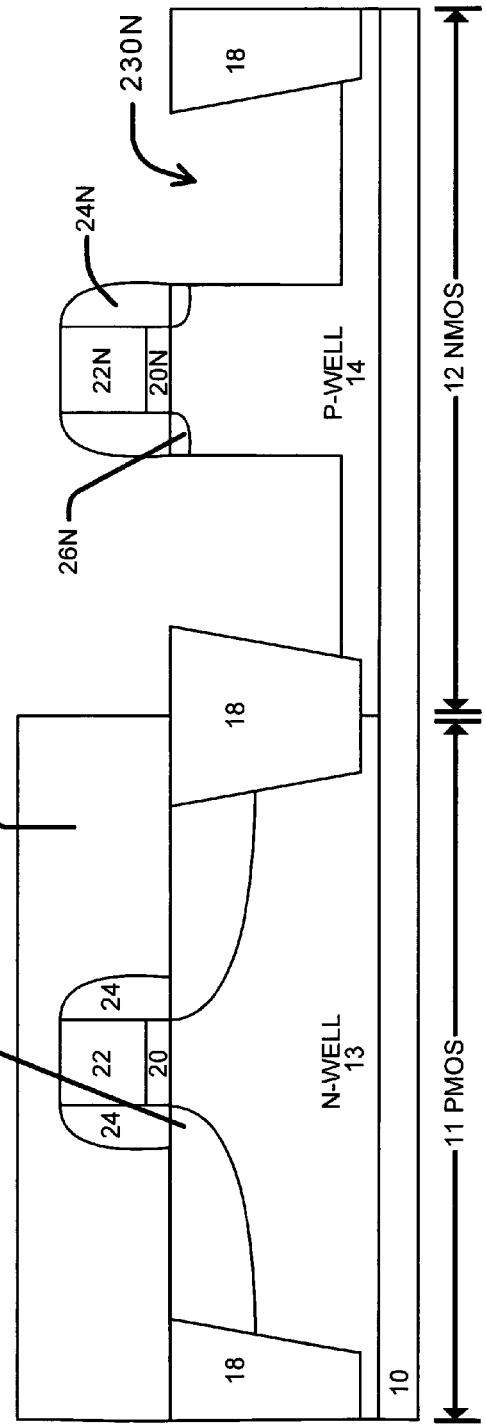

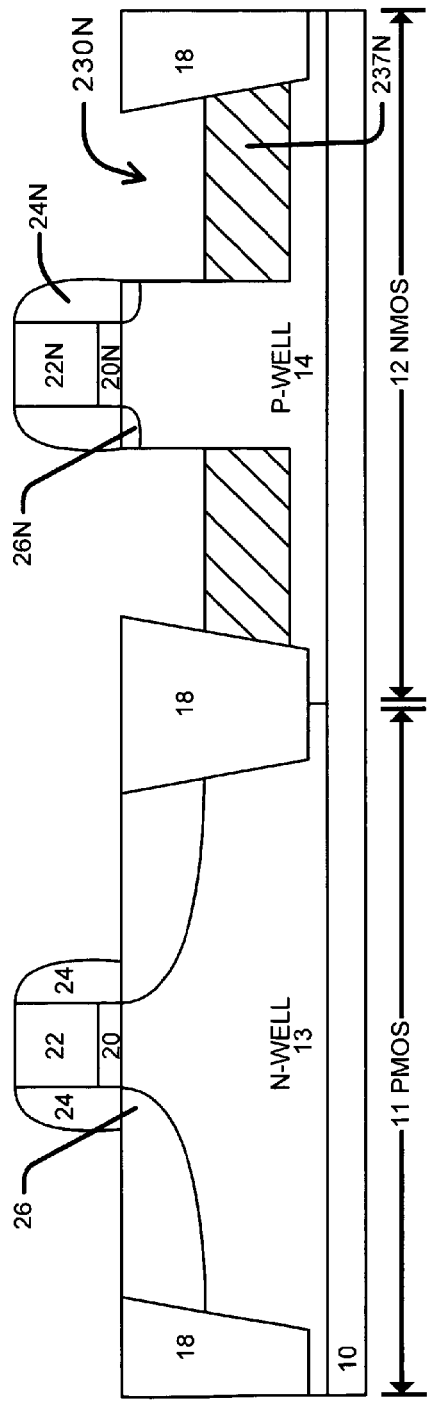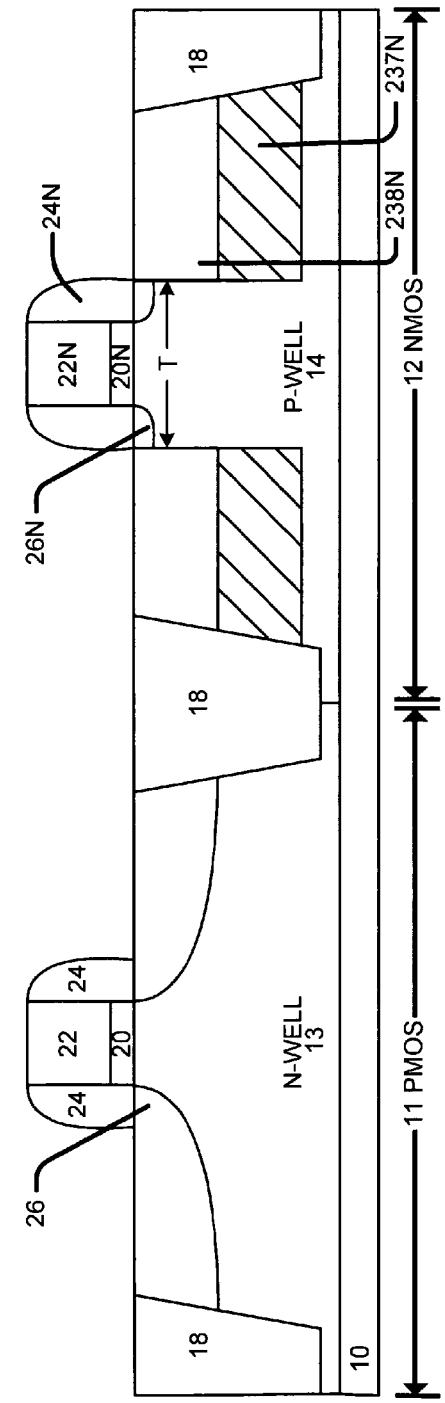
FIGURE 2C
FIGURE 2D

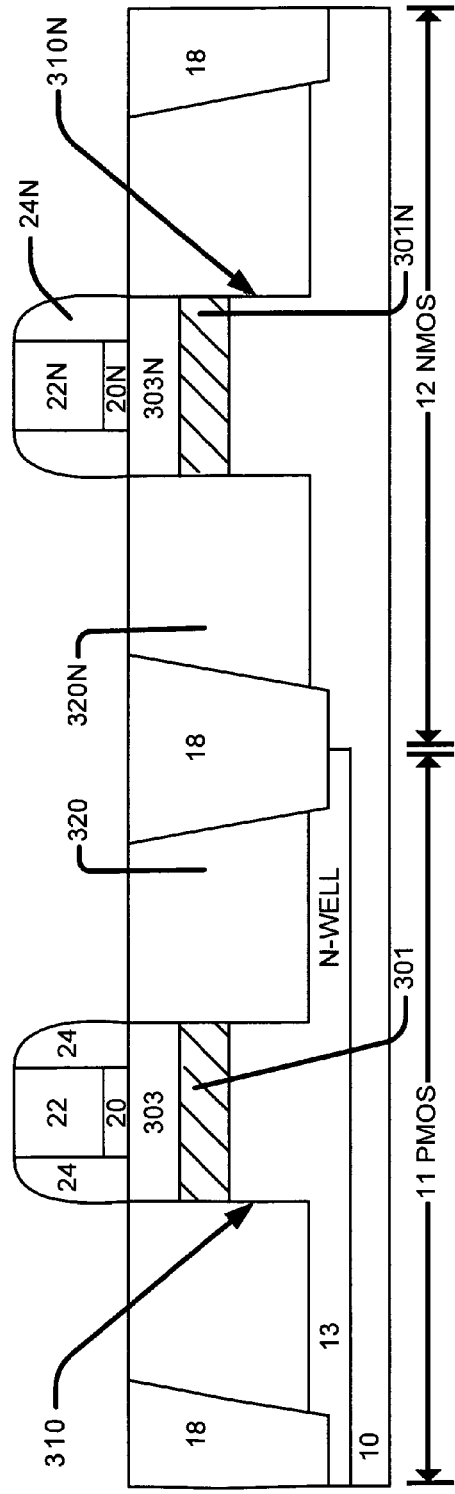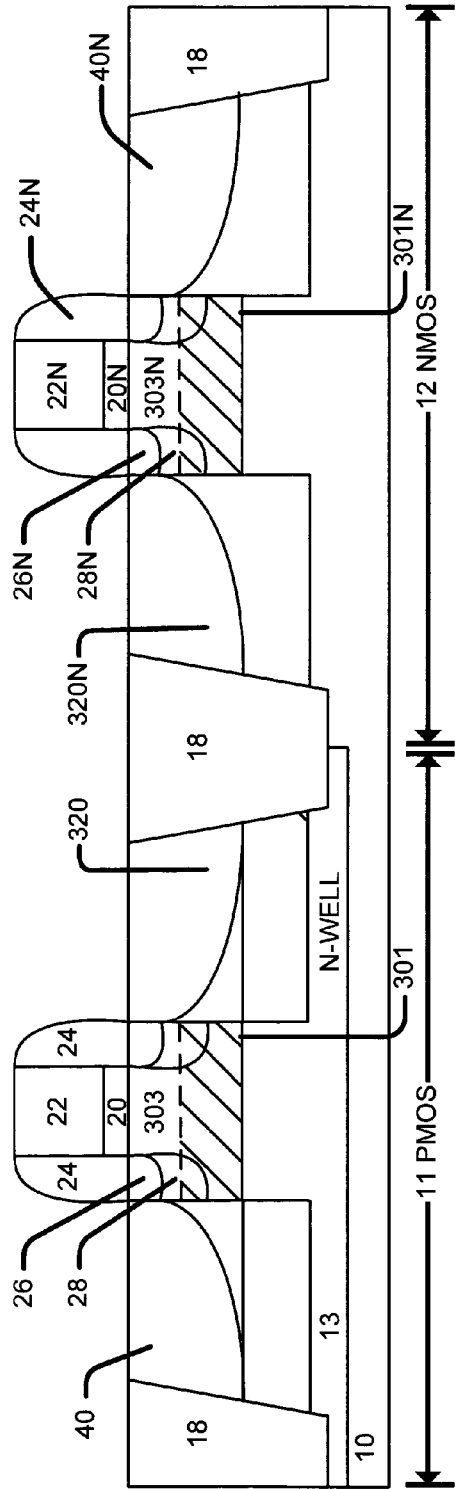
FIGURE 3E
FIGURE 3F

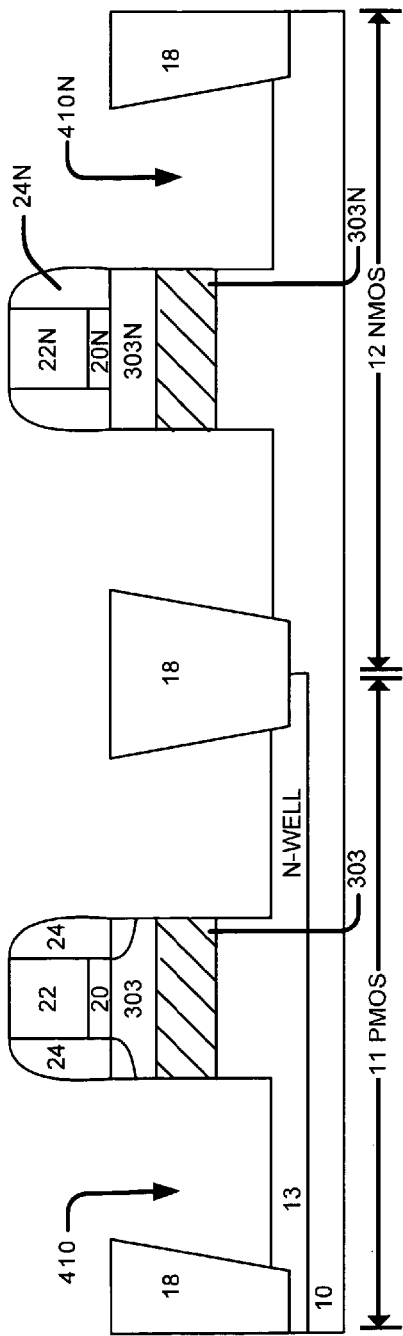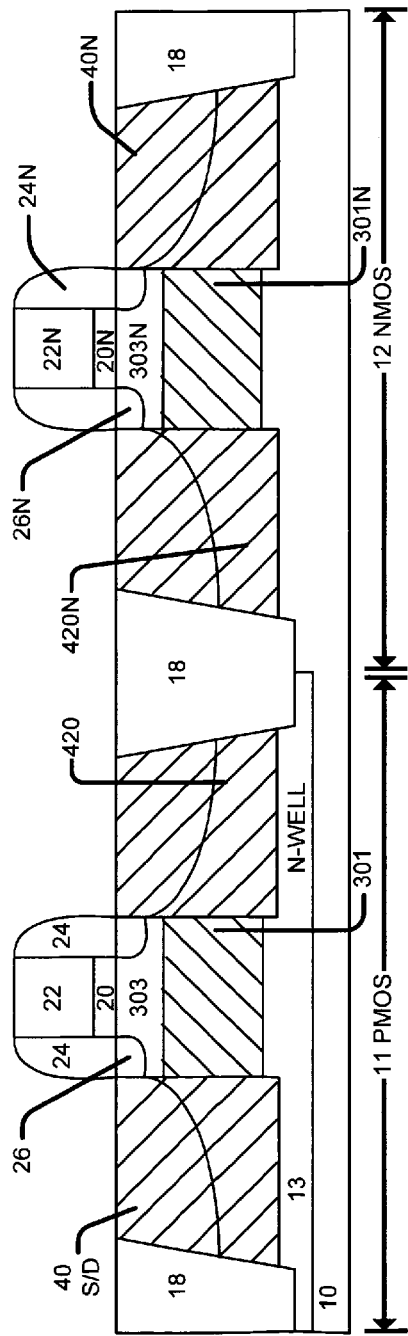

Table 1

IMPlant process        57KeV, 5.2e13 As

| Process | Stress (As deposited) | After As implant+RTA | Percentage of the retained stress |
|---|---|---|---|
| SiGe POS Without B | -1.65E+09 | -2.98E+08 | 18.07 |
| with MMS, CN=0.5 sccm | -1.64E+09 | -8.17E+08 | 49.83 |
| with MMS, CN=1.2 sccm | -1.52E+09 | -8.05E+08 | 52.84 |

Table 2

IMPlant process        3KeV, 6e14, BF2

| Process | Stress (As deposited) | After BF2 implant+RTA | Percentage of the retained stress |
|---|---|---|---|
| SiGe POS Without B | -1.65E+09 | -1.56E+09 | 94.29 |
| with MMS, CN=0.5 sccm | -1.64E+09 | -1.55E+09 | 94.82 |
| with MMS, CN=1.2 sccm | -1.52E+09 | -1.46E+09 | 95.88 | table 3

IMPlant process        7KeV, 1.5e15 B

| Process | Stress (As deposited) | After B implant+RTA | Percentage of the retained stress |
|---|---|---|---|
| SiGe POS Without B | -1.65E+09 | -6.10E+08 | 36.94 |
| with MMS, CN=0.5 sccm | -1.64E+09 | -1.03E+09 | 62.86 |
| with MMS, CN=1.2 sccm | -1.52E+09 | -1.25E+09 | 82.22 | table 4

IMPlant process        17KeV, 2.5e15, BF2

| Process | Stress (As deposited) | After BF2 implant+RTA | Percentage of the retained stress |
|---|---|---|---|
| SiGe POS Without B | -1.65E+09 | -8.02E+08 | 48.62 |
| with MMS, CN=0.5 sccm | -1.64E+09 | -9.89E+08 | 60.35 |
| with MMS, CN=1.2 sccm | -1.52E+09 | -1.05E+09 | 69.13 |

IMPLANT DAMAGE CONTROL BY IN-SITU C DOPING DURING SIGE EPITAXY FOR DEVICE APPLICATIONS

CROSS REFERENCE TO RELATED APPLICATIONS

This patent application is a divisional of co-pending U.S. patent application Ser. No. 13/113,107, filed on May 23, 2011, which is a continuation of U.S. patent application Ser. No. 11/502,132, filed on Aug. 9, 2006, now issued as U.S. Pat. No. 7,947,546 entitled Implant damage control by in-situ C doping during SiGe epitaxy for device applications, which claims priority at least under 35 U.S.C. 119(e) from the US provisional patent application:

Ser. No. 60/732,354, Filing date Oct. 31, 2005, entitled Implant damage control by in-situ C doping during SiGe epitaxy for device applications, first named inventor Jin Ping Liu, Singapore, SG, Confirmation Number: 5534. The entire contents of these related applications are incorporated herein by reference in their entirety.

BACKGROUND OF INVENTION

1) Field of the Invention

Some example embodiments of the present invention relates to a semiconductor device with lattice-mismatched zone and fabrication method thereof, and more specifically to a strained-channel transistor structure and fabrication method thereof and more particularly to a strained-channel transistor structure and fabrication method comprising a Carbon doped SiGe layer.

2) Description of the Prior Art

Size reduction of the metal-oxide-semiconductor field-effect transistor (MOSFET), including reduction of gate length and gate oxide thickness, has enabled a continuous improvement in speed performance, density, and cost per unit function of integrated circuits during the past few decades.

In order to further enhance performance of the transistor, stress/strain may be introduced in the transistor channel to improve carrier mobility to enhance performance of the transistor in addition to device scaling. There are several existing approaches to introducing strain in a channel region of the transistor.

U.S. Pat. No. 6,844,227: Semiconductor devices and method for manufacturing the same—Inventor: Kubo, Minoru; Mie, Japan US20040262694A1: Transistor device containing carbon doped silicon in a recess next to MDD to create strain in channel Inventor: Chidambaram, P R U.S. Pat. No. 6,190,975: Method of forming HCMOS devices with a silicon-germanium-carbon compound semiconductor layer Inventor: Kubo, Minoru; Mie, Japan U.S. Pat. No. 6,576,535: Carbon doped epitaxial layer for high speed CB-CMOS—Inventor: Drobny, Vladimir F;

U.S. Pat. No. 6,190,975 and US20020011617A1: semiconductor device and method of producing the same—Inventor: KUBO, MINORU; MIE, Japan US20050035369A1: Structure and method of forming integrated circuits utilizing strained channel transistors—Inventor: Lin, Chun-Chieh; Hsin-Chu, Taiwan However, there is a need to improve upon these methods.

SUMMARY OF THE INVENTION

Some example embodiments of the invention comprise a semiconductor structure comprised of:

a MOS transistor on a substrate, the MOS transistor comprised of source/drain regions, a gate dielectric, a gate electrode, channel region;

a carbon doped SiGe region that applies a stress on the channel region whereby the carbon doped SiGe region retain strain on the channel region during subsequent heat processing.

A first example method embodiment, for forming a semiconductor device comprising the steps of:

providing a gate over a substrate;

etching S/D recesses in the substrate adjacent to the gate;

at least partially filling the S/D recesses with a carbon doped SiGe layer;

forming source and drain regions about adjacent to the gate at least partially in the carbon doped SiGe layer;

whereby the carbon doped SiGe layer puts a uniaxial strain on a channel region under the gate.

A second example method embodiment for forming a semiconductor device comprising the steps of:

providing a gate dielectric layer, and a gate over a substrate; the substrate comprised of silicon;

etching S/D recesses in the substrate adjacent to the gate;

partially filling the S/D recesses with a carbon doped SiGe layer;

forming a top S/D Si-containing layer over the carbon doped SiGe layer;

forming source and drain regions at least partially in top S/D Si-containing layer; whereby the carbon doped SiGe layer puts a uniaxial strain on a channel region under the gate.

A third example method embodiment for forming a semiconductor device comprising the steps of:

forming a carbon doped SiGe layer over a substrate; the substrate comprised of silicon;

forming a top silicon layer over the carbon doped SiGe layer;

forming gate dielectric layer, a gate over the top silicon layer;

etching S/D recesses in the substrate adjacent to the gate;

at least partially filling the S/D recesses with a silicon containing layer;

forming source and drain regions in at least partially in the silicon containing layer;

whereby the carbon doped SiGe layer puts a uniaxial strain on a channel region under the gate.

A fourth example method embodiment for forming a semiconductor device comprising the steps of:

forming a center carbon doped SiGe layer over a substrate; the substrate comprised of silicon;

forming a top silicon layer over the center carbon doped SiGe layer;

forming a gate dielectric layer, and a gate electrode over the top silicon layer;

etching S/D recesses in the substrate adjacent to the gate; and at least partially filling the S/D recess with a S/D carbon doped SiGe layer.

forming source and drain regions adjacent to the gate at least partially in the S/D carbon doped SiGe layer.

An aspect of all example embodiments is wherein the center carbon doped SiGe layer has a Si atomic % between 68.8% and 84.9%;

a Ge atomic % between 15 and 30%;

a C atomic % between 0.1 and 0.2%.

An aspect of all example embodiments is the center carbon doped SiGe layer has a C concentration can be about between 1E19 and 1E20 atom/cc.

An aspect of all example embodiments further comprises; after forming the carbon doped SiGe layer; annealing the substrate at a temperature over 400 C.

A main advantage of the embodiments is that the SiGeC stressor regions retain their stress on the channel region after heat processes greater than 400 C and especially after heat processes greater than 900 C.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A through 2E are cross sectional views for illustrating a method for manufacturing semiconductor device according to a second example embodiment of the present invention.

FIGS. 3A through 3F are cross sectional views for illustrating a method for manufacturing semiconductor device according to a third example embodiment of the present invention.

FIGS. 4A through 4B are cross sectional views for illustrating a method for manufacturing semiconductor device according to an fourth example embodiment of the present invention.

FIG. 6A is a table showing the results of an experiment involving the example embodiment's C doped SiGe layers.

DETAILED DESCRIPTION OF THE EXAMPLE EMBODIMENTS

Overview

Non-limiting example embodiments of the invention form carbon doped SiGe stressor layers (SiGeC) that retain their strain after ion implants and/or heat cycles. The carbon doped SiGe stressor layers can be used in MOS transistors to put stress on the MOS channel regions to improve transistor performance. The embodiments' carbon doped SiGe stressor layers (SiGeC) can also reduce Ion implant damage in adjacent, proximate or overlaping doped regions. Preferably the carbon doped SiGe stressor layers are formed using an epitaxial process. The SiGeC regions can put a uniaxial stress on the MOS channel regions. A point of some example embodiments is that the C in the SiGe layers enables the SiGeC layer to maintain stress on the substrate even after subsequent heat cycles, such at over 400 C and especially over 900 C. The inventors have found that SiGe loses it's stress after heat cycles/anneals. The embodiment's C in the carbon doped SiGe stressor layers helps the SiGeC layer retain stress even when annealed at temperature between 400 C to 1300 C and more preferably between 900 and 1090 C and more preferably above 900 C.

Four example embodiments are described below.
Terminology:
SiGeC means carbon doped silicon germanium (e.g., $Si_{1-x-y}Ge_xC_y$) (Silicon germanium carbon alloy).
Junction depth or depth of doped region—defined as depth from substrate surface where the n and p concentration are about equal. Schematically, the drawn junctions represent the boundary at which the n-type and p-type dopant are equal. These can be adjusted with adjusting the implant profiles either with different implant energy, dose and species type. In general, in the figures, the junction depth of the doped regions corresponds to a dopant concentration about 1E17 atom/cc.
SDE—source drain extension

I. First Embodiment a PMOS FET with S/D Regions in a SiGeC Region

FIG. 1D

An example embodiment comprises a PMOS transistor with one or more of the doped source/drain regions comprised at least partially with the SiGeC region. The SiGeC region can effectively put a uniaxial compressive strain on the PMOS channel.

Figure 1A:
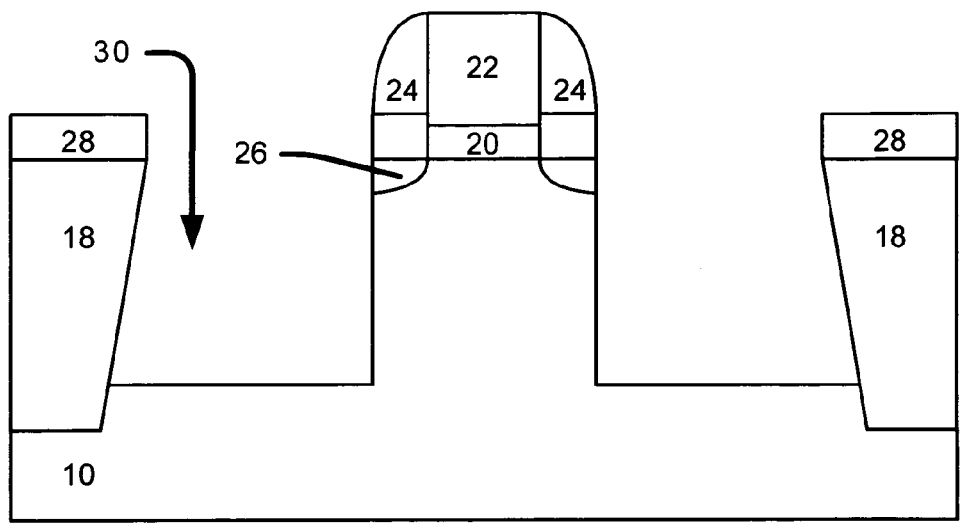
FIGS. 1A through 1E are cross sectional views for illustrating a structure and method for manufacturing semiconductor device according to a first example embodiment of the present invention.
Figure 1B:
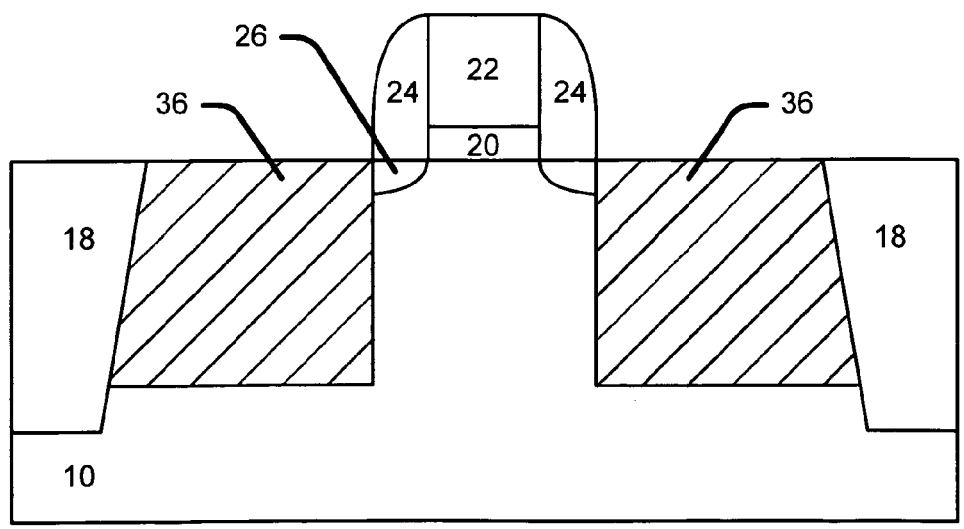
Figure 1C:
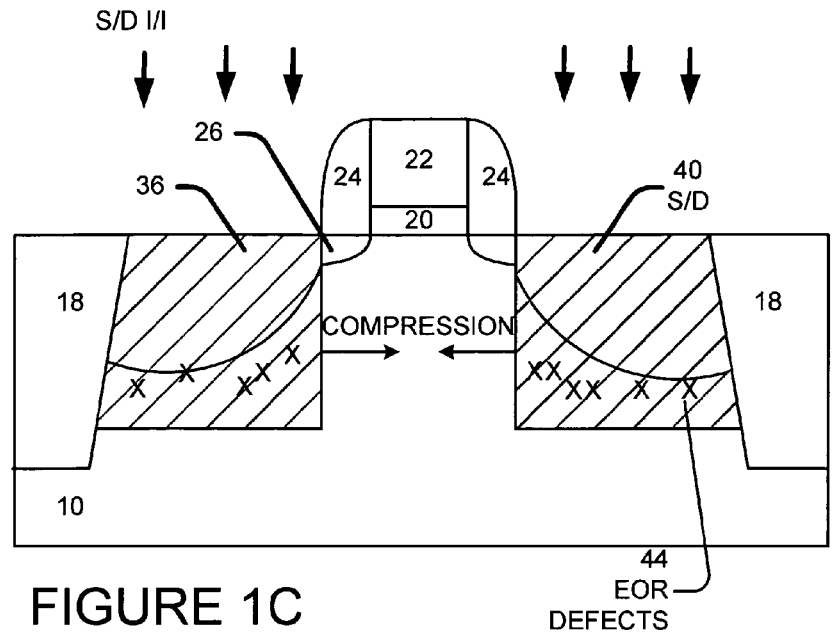
Figure 1D:
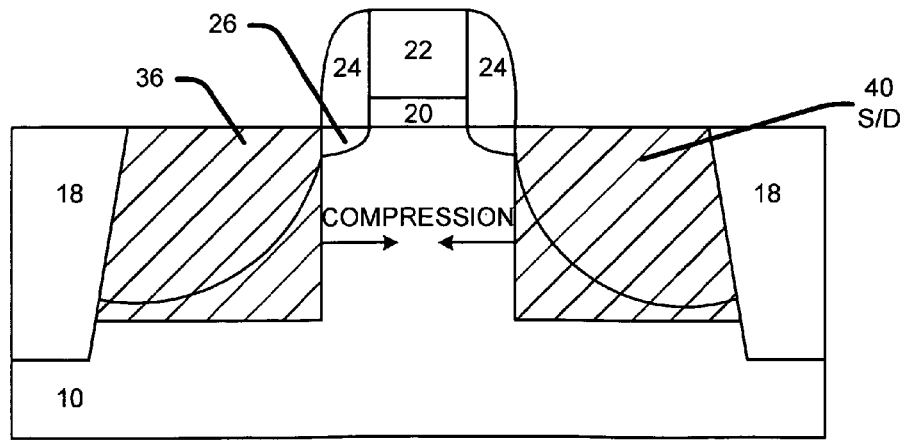

A first example embodiment is shown in FIG. 1D.

FIG. 1D shows a substrate with carbon doped SiGe regions 36 in the substrate 10 adjacent to the gate structure 20 22 of a PMOS transistor 50P. The PMOS transistor 50P can be comprised of a gate dielectric, gate, spacers, source/drain (S/D) regions and source-drain extensions (SDE) regions. The transistor can further comprise other elements such as Halo or pocket implants (not shown).

FIG. 1C shows the source/drain regions 40 can be formed totally within the Carbon doped SiGe regions 36. The source/drain regions 40 can be formed by implanting p-dopants such as B or BF2 in the substrate. The implants can create End of range defects (EOR defects) or other defects 44 as shown in FIG. 1C.

The SiGeC layer 36 preferably has about the following concentrations:
Si atomic % between 68.8% and 84.9% (tgt=74.85)
Ge atomic % between 15 and 30% (target=25%)
C atomic % between 0.1 and 0.2% (target=0.15%)

In another measurement units, the C concentration can be about between 1E19 and 1E20 atom/cc.

The SiGeC layer can have these concentrations and concentration profiles in all embodiments (e.g., PMOS and NMOS).

The SiGeC layer 36 can have an about constant C concentration or can have a C concentration that varies between about 0.1 and 0.1 with depth.

The carbon doped SiGe layer is preferably formed by a selective epitaxy process, such as a LPCVD process.

The SiGe regions reduce the defects from the S/D ion implant (I/I) and from any other implants such as a halo implant or pocket implant (not shown).

A. First Embodiment

Example Method—C-doped SiGe S/D Fill Regions

A non-limiting example method for the 1st example embodiment is shown in FIGS. 1A to 1E. It is understood that there are alternative methods to form the 1st example embodiment and this example does not limit the embodiment.
FIG. 1A FIG. 1A shows a cross sectional view of a gate structure 20 22 24 over a substrate 10. In this non-limiting example, the Tx is a PMOS 50P.

A gate structure can be comprised of a gate dielectric 20, a gate electrode 22, and spacers 24. A MOS transistor 50P can be comprised of the gate structure 20 22 24, a channel region under the gate electrode 22 and gate dielectric 20 in the substrate 10.

The substrate 10 can be a silicon or SOI substrate. The upper substrate surface is preferably comprised of Si and can have a (100), (110), or (111) crystal orientation or other orientations and preferably a (100) orientation.

Isolation regions 18 can be formed in the substrate and can separate PMOS regions 11 and NMOS regions 12. (see FIG. 1E).

We can form LDD regions (or SDE) 26 in the substrate adjacent the gate before the spacers 24 are formed.

We etch S/D trenches 30 in the substrate 10 adjacent to the gate structures. We can use a trench resist mask 28 and the gate structures and the isolation regions as etch masks. We can remove the resist mask after the trenches are formed. The trench can have a depth between 700 and 2000 angstroms.
FIG. 1B As shown in FIG. 1B, we form a SiGeC layer 36 at least partially filling the S/D recesses/trenches 30. The SiGeC layer 36 is preferably formed by a selective epitaxial process that can at least fill the S/D recesses/trenches 30.
FIG. 1C As shown in FIG. 1C, we preferably implant dopant ions to form the source and drain (S/D) regions 40. For this PMOS example, the ions are p-type such as B, or BF2.

The S/D implant can form end of range (EOR) defects (and other defects) 44 near the bottom and below of the S/D regions 40.

Preferably the SiGeC region 36 has a lower depth at least 2.0 to 3.0 Rp (projected range) of the S/D implant. This depth helps ensures that the defects 44 are contained mostly within the SiGeC region 36 can reduce defects.
FIG. 1D FIG. 1D shows the structure after an anneal. The defects are reduced by the SiGeC layer 36. The defects are reduced especially by the C in the SiGeC layer. The SiGeC layer preferably puts a uniaxial compressive strain (C) on the channel region.

After all heat processing, the SiGeC layer preferably has a depth below the bottoms of the Source and drain regions and preferably the source and drain regions are substantially contained in the SiGeC layers 36.

Figure 1E:
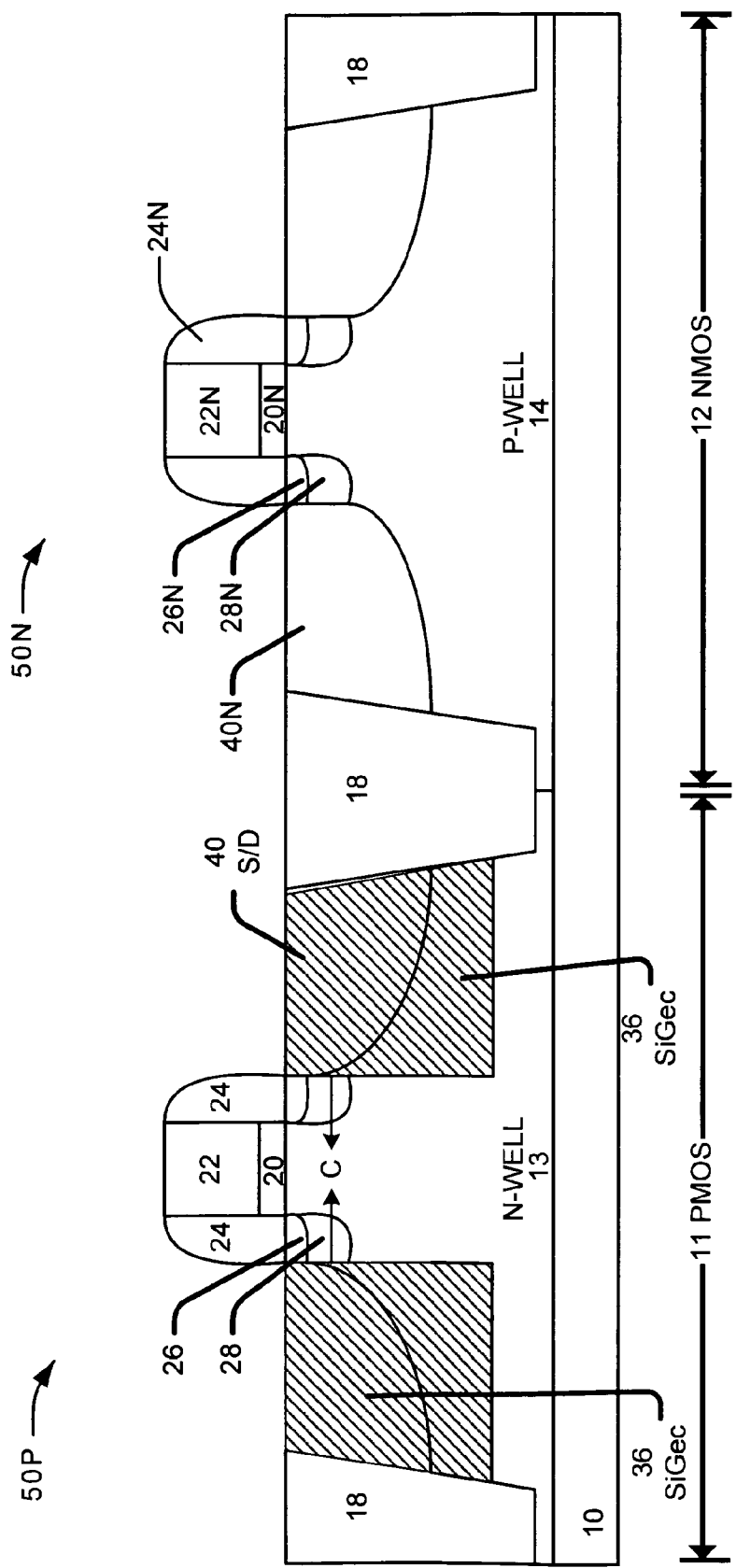

The embodiment's carbon (C) in the SiGeC layer helps the SiGeC layer retain stress even when annealed at temperature Between 400 C to 1300 C and more preferably between 900 and 1090 C.
FIG. 1E FIG. 1E shows a cross sectional view of both PMOS TX 50P and NMOS Tx 50N formed on a substrate. The SiGeC layer 36 was only formed in the PMOS region 11. The SiGeC region 36 puts a compressive stress on the PMOS channel thereby improving the PMOS performance. The NMOS region 12 can be masked during the S/D recess etch in the PMOS region 12.

The NMOS Tx 50N can be comprised of: gate dielectric 20N, gate 22N, spacers 24N, LDD regions 26N, Halo region 28N, S/D region 40N and Pwell 14.

Preferably the SiGeC region 36 has a depth after all anneals (final product stage) that is at least 1% deeper and more preferably at least 10% deeper than the final total depth (measured from the top SiGeC surface) of the source and drain regions 40 and more preferably between 10% and 20% deeper than the final total depth (measured from the top SiGeC surface) of the source and drain regions 40.

B. Uniaxial Strain

In some embodiments, because the SiGeC regions are positioned adjacent to the Gate only in the direction from source to drain (not along the length of the channel), the SiGeC regions impart effectively a uniaxial stress on the channel.

For example in this embodiment shown in FIG. 1D, the SiGeC layer 36 puts a compressive stress/strain (C) on the PMOS channel region below the gate 22 thus improving hole mobility and PMOS transistor performance. Because the lattice constant of the SiGe is larger than that of Si, the channel region between the two SiGe source/drains is placed under compressive stress (C).

II. Second Example Embodiment

SiGeC and Top Si Layer in S/D Recess

A second example embodiment comprises a NMOS transistor with the SiGeC region under and spaced from the source/drain (S/D) regions. The SiGeC region puts at least a tensile strain on the NMOS channel. The S/D regions are preferably substantially in a Si containing layer over the SiGeC regions.

Figure 2E:
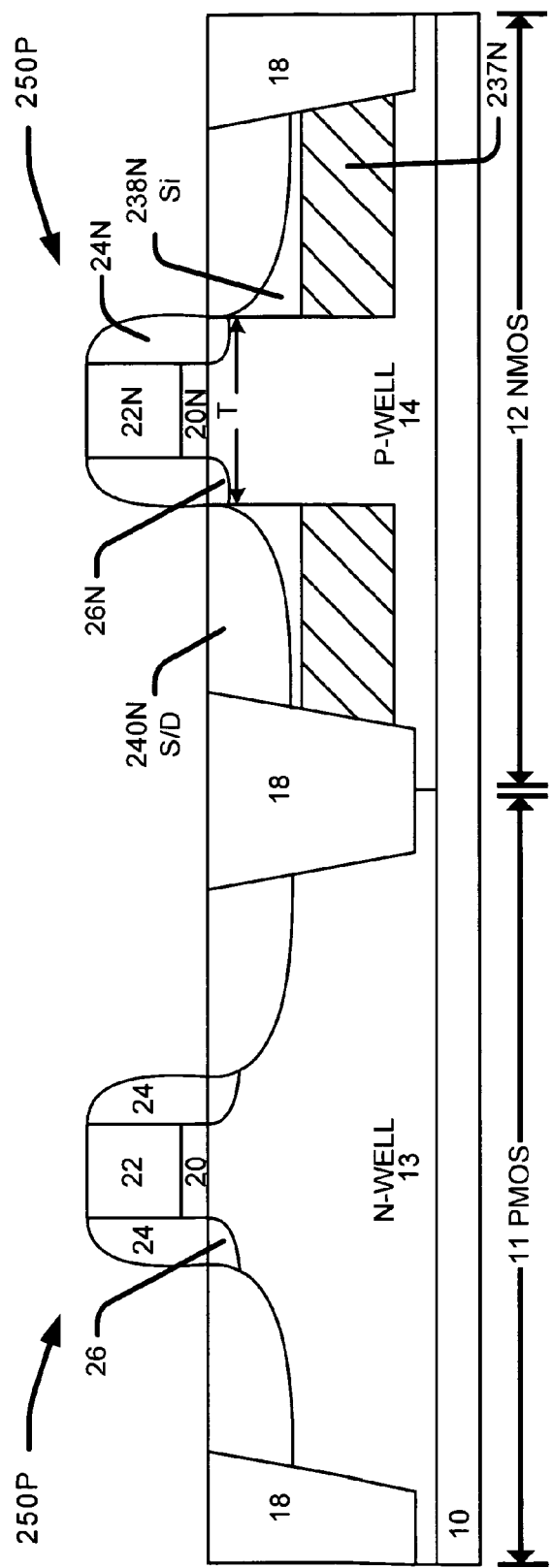

Referring to FIG. 2E, a SiGeC region 237N is formed in a S/D recess 230N (see FIG. 2C) adjacent to the NMOS gate structure 20N 22N.

A top S/D silicon layer 238N is formed over the SiGeC region 237N. The silicon layer can be comprised substantially of silicon. The silicon layer can be doped with N type dopants or undoped.

S/D regions 240N are at least partially formed in the silicon layer 238N and possibly at least partially formed in the SiGeC region 237N.

The SiGeC region 237N preferably puts a uniaxial tension stress on the NMOS channel region.

The SiGeC region 237N helps reduce defects from the S/D I/I.

In addition, the carbon (C) in the SiGeC region 237N helps the SiGeC region 237N retain it's stress during subsequent processes, such as the S/D anneal.

A. Uniaxial Strain

Because the SiGeC regions 237N are positioned adjacent to the gate only in the direction from source to drain (not along the length of the channel), the SiGeC regions effectively imparts a uniaxial stress on the channel. This is not significantly a biaxial strain device.

For example in this embodiment shown in FIG. 2E, The SiGeC layer 237N puts a tensile stress/strain (T) on the NMOS channel region thus improving electron mobility and NMOS transistor performance.

B. Example Method for the Second Embodiment

A non-limiting example method for the second example embodiment is shown in FIGS. 2A to 2E. It is understood that there are alternative methods to form the 2nd example embodiment and this example does not limit the embodiment.

FIG. 2A

FIG. 2A shows a substrate 10 with a NMOS region 12 and a PMOS region 11. A NMOS gate structure 20N 22N 24N is formed over the NMOS region 12. The NMOS gate structure can comprise a NMOS dielectric layer 20N, A NMOS gate 22N and NMOS spacers 24N.

A PMOS gate structure 20 22 24 is formed over the PMOS area 11. The PMOS gate structure can comprise a PMOS dielectric layer 20, A PMOS gate 22 and NMOS spacers 24.

The PMOS region 11 can comprise an optional N-well 13. The NMOS region 12 can comprise an optional P-Well 14.

FIG. 2B

FIG. 2B shows a N-S/D recesses 230N formed adjacent to the N-gate structure. A resist layer 228 can cover the PMOS region 11 or having openings over the NMOS region 12. The resist layer is removed after the recess etch. The trench can have a depth between 700 and 2000 angstroms.

FIG. 2C

FIG. 2C shows a NMOS S/D SiGeC layer 237N formed to at least partially fill the N-S/D recess. The S/D SiGeC layer 237N can be formed using an selective epitaxial process. The S/D SiGeC layer 237N can have the same concentrations as discussed above in the first embodiment.

FIG. 2D

FIG. 2D shows a top NMOS Si containing S/D layer 238N formed over the SiGe C layer 237N. The top N-Si S/D layer 238N is preferably comprised substantially of crystalline silicon.

The top N-Si S/D layer 238N can have a thickness between 500 and 1000 angstroms.

The N-S/D SiGeC layer 237N can have a thickness between 200 and 1000 angstroms.

The SiGeC layer 237N preferably puts a Tensile stress (T) on the NMOS channel for example, roughly between about the SDE regions.

The SiGeC layer 237N preferably has the following concentrations

Si atomic % between 68.8% and 84.9% (tgt=74.85)
Ge atomic % between 15 and 30% (target=25%)
C atomic % between 0.1 and 0.2% (target=0.15%)

FIG. 2E

FIG. 2E shows S/D regions 240N are formed adjacent the gate structure at least partially in the silicon containing layer 238N. The S/D regions 240 are preferably formed by an implant process. Preferably the EOR regions from the S/D implant (before anneal) are located close to the SiGeC region so the EOR defects can be reduced by the SiGeC region.

The S/D regions 240N are least partially formed in the silicon layer 238N and possibly at least partially formed in the SiGeC region 237N.

In an option, after all anneal steps, the S/D regions 240N are substantially contained within the Si containing layer 238N. In another option, all anneal steps, the S/D regions 240N are substantially contained within the Si containing layer 238N and the SiGeC layer.

The SiGeC region 237N preferably puts a uniaxial tension stress on the NMOS channel region.

The SiGeC region 237N helps reduce defects from the S/D Ill.

In addition, the carbon (C) in the SiGeC region 237N helps the SiGeC region 237N retain it's stress during subsequent processes, such as the S/D or silicide anneal.

III. Third Example Embodiment

SiGeC Region Under the Channel Region of a MOS tx

FIGS. 3E and 3F show an example embodiment comprising a SiGeC region under the channel region of a MOS tx. The SiGeC region puts a stress on the channel region of the MOS transistors. In this embodiment the S/D regions preferably are formed in silicon layers, not in SiGec. Depending on the configuration of the SiGeC layer, a uniaxial compressive or a tensile stress can be placed on the channel regions.

A. Method for the Third Example Embodiment

A non-limiting example method for the $3^{rd}$ embodiment is shown in FIGS. 3A to 3E. It is understood that there are alternative methods to form the $3^{rd}$ example embodiment and this example does not limit the embodiment.

Depending on the device geometry, the stress can be tuned to be largely uniaxial or biaxial. By tuning the stress tensor, (e.g., compressive or tensile) one can use the film for either N or P MOS or both.

Figure 3A:
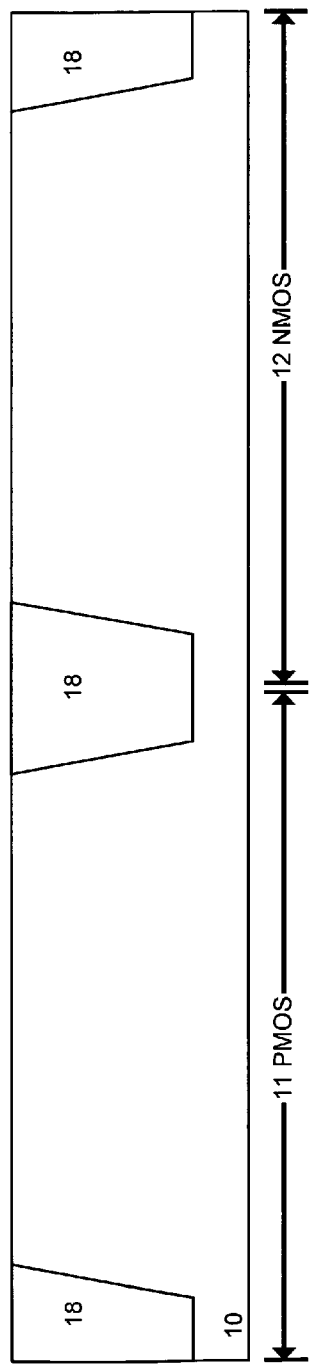

As shown in FIG. 3A, a semiconductor substrate 10 is provided having spaced isolation regions 18 defining at least a PMOS region 11 and a NMOS region 12.

Figure 3B:
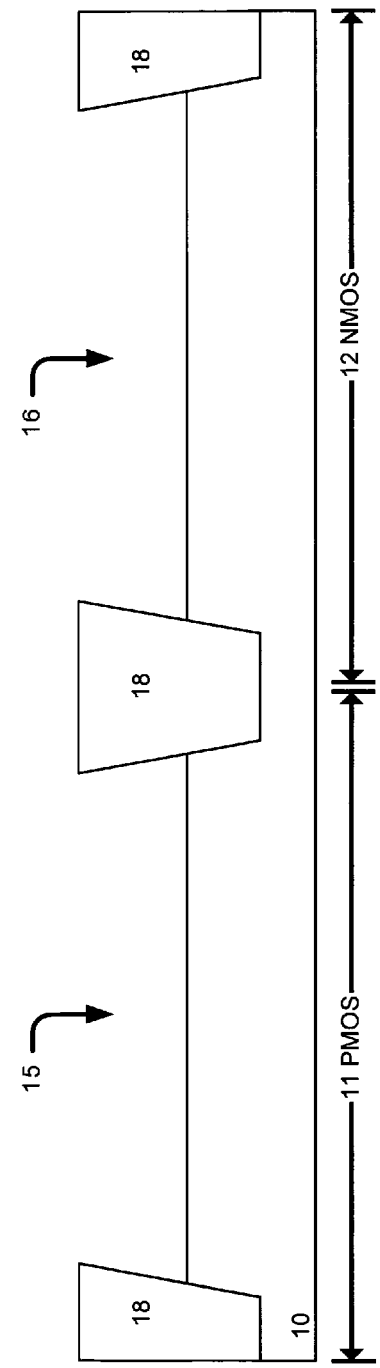

As shown in FIG. 3B, we etch back the silicon containing substrate 10 surface to form stressor recesses 15 16. The stressor recesses can have a depth between 500 and 1500 angstroms. We can use the isolation regions 18 as an etch mask.

Figure 3C:
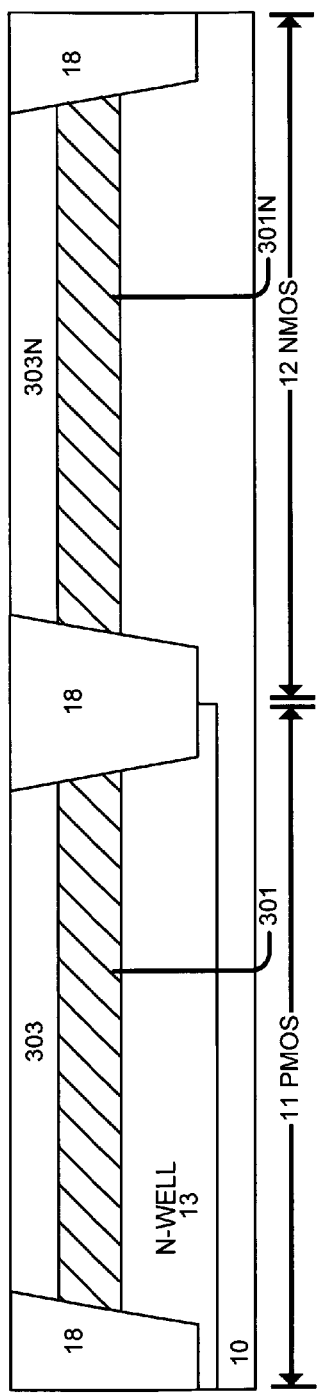

As shown in FIG. 3C, we can selectively form a SiGeC layer 301 301N over the substrate surface. The PMOS SiGeC layer 301 and the NMOS SiGeC layer 301N can be formed in 2 separate steps so that their compositions are different. The areas that we do not want the SiGeC can be covered. That is we can tune SiGeC layers 301 301N to have the proper compression and tensile stress for the type devices (PMOS or NMOS) we are forming.

The SiGeC layer preferably has thickness between 50 and 100 nm. (500 and 1000 angstroms). The Si & Ge & C concentrations in the SIGE C layer 301 301N can be as described above in the other embodiments.

Next an upper channel Si-containing layer 303 303N is formed over the SiGeC layer 30 301N. The Si-containing layer 303 303N preferably has thickness between 20 and 50 nm (200 and 500 Angstroms). The silicon containing layer 303 303N can consist substantially of crystalline silicon. The channel region is preferably at least partially in the upper channel Si-containing layer 303 303N. In an aspect, the channel region is fully in the upper channel Si-containing layer 303 303N.

An optional N-Well 13 can be formed at any time. An optional P well (not shown) can also be formed at any time.

Figure 3D:
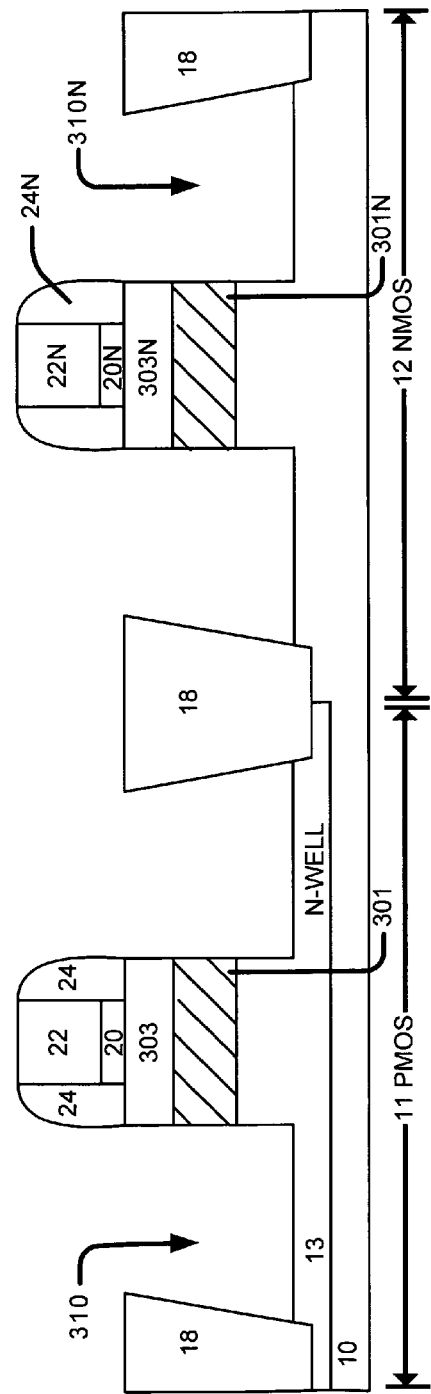

Referring to FIG. 3D, we form S/D recesses 310 310N in the silicon layer 303 303N, the SiGeC region 301 301N and possibly in the substrate 10.

Referring to FIG. 3E, we fill the PMOS S/D recesses 301 and NMOS S/D recesses 310N with a silicon continuing material 320 320N and preferably substantially with Si or crystalline Si. In an aspect, the PMOS S/D recess 301 are filled with a different material than the NMOS S/D recesses. In another aspect, either the PMOS S/D recess 301 or the NMOS S/D recess 301N or both are filled at least partially with SiGe or SiGeC. In an aspect, the Si material is comprised of 2 layers, a bottom SiGeC layer and an top Si layer. This could allow further tailoring the stress, mobility and performance of the NMOS and PMOS regions.

Referring to FIG. 3F, we perform a S/D implant to form PMOS S/D regions 40 in some combination of the silicon region, SiGeC region and the substrate.

The S/D implant comprises implanting Boron, Bf2, As, P or Sb ions into the substrate.

We can form NMOS S/D regions 40N adjacent to the NMOS gate.

Next, halo implants can be performed to form NMOS halo regions 28N and PMOS halo regions 28. Masking steps (not shown) can be used to mask the proper areas.

In one aspect, the entire LDD (or SDE) region 26 is contained in the upper channel Si-containing layer 303 303N. and the silicon continuing material 320 320N.

In this example, a NFET is formed in the NMOS region 12 and a PFET is formed in the PMOS region 11. There are other combinations. The embodiment's SiGeC may only be formed in the NMOS region and the PMOS regions can be standard devices or any of the other embodiments in this disclosure.

Non-Limiting Review of Example Embodiment

SiGeC Layer Under the Channel

The SiGeC layer 301 301N under the PMOS or NMOS channel provides defect gettering from the implanted doped regions (e.g, SDE and S/D and Halo) and maintains stress on the channels from the SiGeC regions 301 301N.

Depending on the device geometry, the stress can be tuned to be largely uniaxial or biaxial. By tuning the stress tensor (SiGeC regions), one can use the file for either NMOS or PMOS devices or both.

Depending on the SiGeC stressor composition and geometry, the PMOS SiGeC layer 303 can put compressive stress on the PMOS channel. Depending on the SiGeC stressor composition and geometry, the NMOS SiGeC layer 303N can put a tensile stress on the NMOS channel.

Other steps to form a completed device can be performed in any other using processes known by those skilled in the art.

IV. Fourth Example Embodiment

In a fourth example embodiment shown in FIGS. 4A and 4B, a first (or a center) SiGeC or SiGe layer 303 303N is formed under the channel of a MOS transistors. A second SiGe or SiGeC layer 420 420N is formed in S/D recesses 410 410N. The second (or center) SiGeC or SiGe layer (or S/D SiGe or S/D SiGe C layer) 420 420N can be under the doped S/D regions, contained within the S/D region, or partially overlap the S/D region or any combination of the above. Preferably the S/D SiGE or S/D SiGe C layer 420 420N fills the entire S/D recess 410 410N and extends below the S/D regions.

An example method for the fourth embodiment begins as described above for the third embodiment and shown in FIGS. 3A to 3C. Note that the PMOS SiGeC layer 301 and the NMOS SiGeC layer 301N can be formed in 2 separate steps so that their compositions are different. Next, referring to FIG. 4A, we etch S/D recesses 410 410N adjacent to the gate structures.

Referring to FIG. 4B, we fill the S/D recesses 410 410N at least partially with a SiGeC or SiGe layer 420 420N. FIG. 4B shows the aspect where the SiGeC substantially fills the S/D recesses. The PMOS S/D recesses 410 and NMOS S/D recesses 410N can be filed with SiGeC or SiGe in separate steps so that the second (or center or SD) SiGeC or SiGe layers 420 and 420N can have different compositions. The second (or center or S/D) SiGeC or SiGe layers 420 and 420N can have different compositions that create different amounts and types (compressive or tensile) of stress in the respective channels.

Next, the devices can be completed by for example, forming S/D regions 40 40N, and Halo implants (not shown).

Depending on the device geometry, the stress can be tuned to be largely uniaxial or biaxial. By tuning the stress tensor, one can use the film for either N or P MOS or both.

For the PMOS Tx, the S/D SiGeC 420 and channel SiGeC 301 can put a compressive stress on the PMOS channel.

For the NMOS Tx, the S/D SiGeC 420N and channel SiGeC 301N put a tensile stress on the NMOS channel.

Another possible aspect of the fourth embodiment is shown in FIG. 2E, where the SiGeC layer 237N partially fills the S/D recess and a silicon layer 240N is formed over the second SiGeC region 237N. The aspect might be used in a NMOS transistor.

A. Examples

Impact of In-Situ C Doping on Implant Damage and Strain Relaxation of Epitaxial SiGe Layer on Si In this example, implant damage and strain relaxation in thin epitaxial SiGe layers on Si (001) and their dependence on in-situ C doping in epitaxial SiGe are studied. For a 65 nm SiGe layer with ~25% Ge, conventional implants used for p-MOS S/D, halo and extension led to significant implant damage and strain relaxation. Two defect bands were observed, one close to the surface and the other at SiGe/Si interface. In-situ C doping ($10^{19\text{-}20}/cm^3$) was found to eliminate the implant damage close to SiGe/Si interface area and prevent significant strain relaxation.

Here we study the implant damage and strain relaxation in thin epitaxial SiGe films (later referred to as SiGe) and in-situ C doped SiGe films (later referred to as SiGeC) on Si (001) substrates. We show that for a 65 nm SiGe layer with ~25% Ge, conventional implants used for p-MOS S/D, halo and extension lead to significant implant damage and strain relaxation. Two defect bands are observed: one is close to the surface and the other is at SiGe/Si interface. In-situ C doping ($10^{19\text{-}20}/cm^3$) is found to eliminate the implant damage close to SiGe/Si interface area and prevent significant strain relaxation.

Figure 5A:
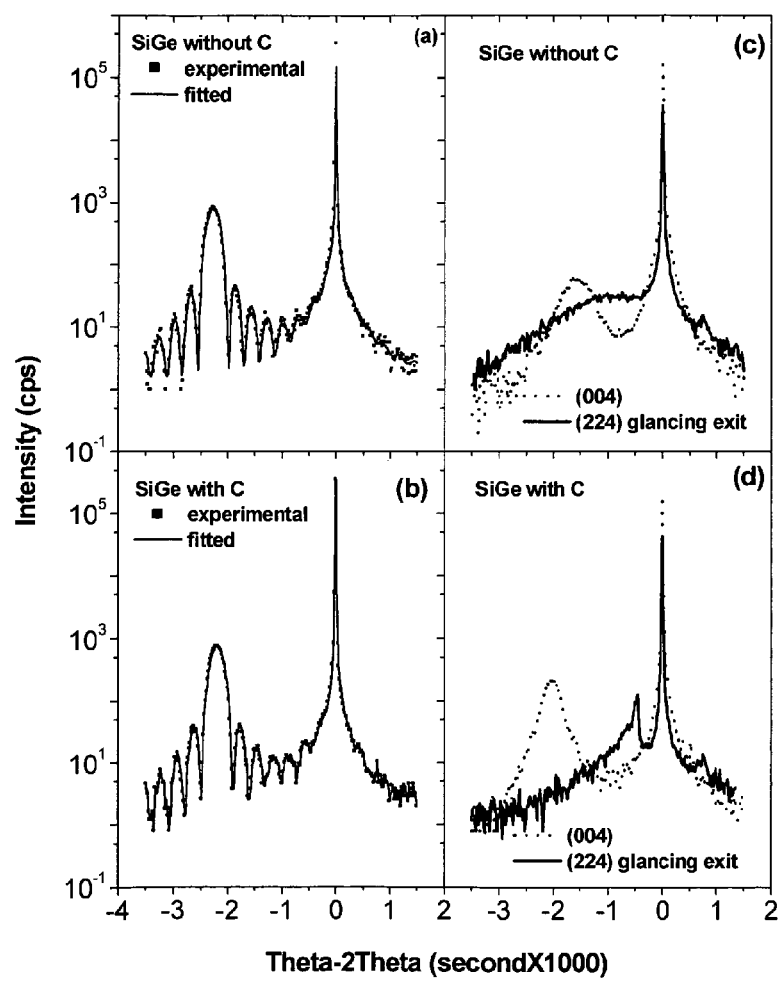
FIG. 5A, shows rocking curves of SiGe layers without C in-situ doping (control cell) for a) as grown, c) after B implantation and high temperature anneal; Rocking curves of SiGe layers with C in-situ doping (invention) for b) as grown, and d) after B implantation and high temperature anneal.

Epitaxial SiGe and SiGeC growth was performed on a commercially available LPCVD system. An additional C precursor was used for in-situ C doping under otherwise identical conditions. After epi growth, wafers were implanted using typical conditions for P-MOS S/D, halo, and extensions. Typical results are presented here from two different implants: 1) B implant with energy of several KeV and dose about $10^{15}/cm^2$, and 2) As implant with energy of tens of KeV and dose of $10^{13}/cm^2$. After implantation, wafers were rapid thermal annealed at high temperature (>1000 C). The strain relaxation and implant damage were characterized by high-resolution XRD and cross-sectional TEM. FIG. 5A shows XRD results for (a) as grown SiGe layers, (b) as grown SiGeC, and (c) as B-implanted and annealed SiGe as well as (d) as B-implanted and annealed SiGeC. Well defined thickness fringes are seen in the as-grown films (FIG. 5A (a) and (b), indicating little strain relaxation and smooth interface. Fitting the rocking curve for the SiGe layer in FIG. 5A(a) using commercially available software gives a Ge composition of 24.3% and a thickness of 65 nm. Assuming the same Ge composition as in SiGe layer, the substitutional C composition is determined to be 0.07% by fitting 5A(b) and using a non-linear relationship between C content and the lattice constant. This result is close to SIMS data indicating ~100% substitutionality. After B implant and anneal, the (004) peak location for SiGe layer moves to lower angle and the thickness fringes disappear, indicating significant strain relaxation. The (224) reflection shows a broad peak, consistent with (004) reflection results. With no appreciable Ge interdiffusion during the anneal (AES results not shown), i.e., no change in Ge composition in the SiGe layer, a strain relaxation of ~70% is calculated from (004) peak shifts shown in FIGS. 5(a) and (c). Compared to SiGe layer, SiGeC layer shows less (004) peak shift to lower angle, and (224) reflection shows a sharp peak above a broad peak (FIG. 1(d)). The strain relaxation degree, if determined from (004) peak shift, is ~13%. The sharp peak in (224) reflection (FIG. 5A (d), solid line), however, corresponds to a fully coherent SiGe layer, indicating nearly 0% strain relaxation. The apparent inconsistency can be explained by the microstructure of the epi films revealed by the TEM results shown in FIG. 5B.

Figure 5B:
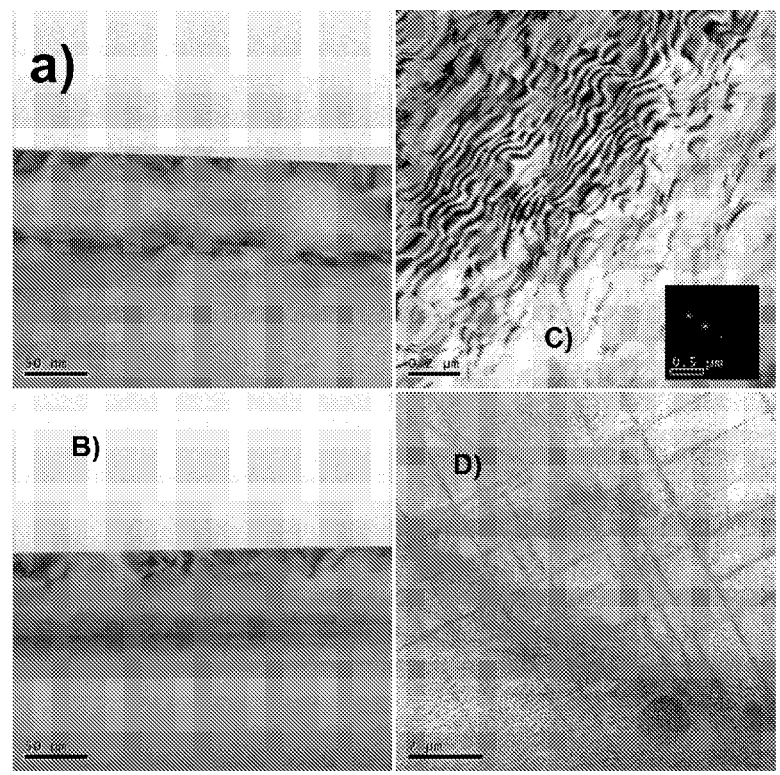
FIG. 5B contains cross-sectional/plan-view TEM images of SiGe layers after B implantation and high temperature anneal for a)/c) without and b)/d) with C in-situ doping (invention's cell).

For the implanted SiGe layer, we observed two bands of defects (FIG. 5B (a)), one close to the surface and the other at the SiGe/Si interface. The defects in the surface band are of the stacking fault tetrahedral type, while the dense arrays at the interface are misfit dislocations. The dominating features in the plan-view TEM (FIG. 5B (c)) are Moiré fringes, which obscure any contrast from the defects in either the surface or interface bands seen in FIG. 5B (a). Unlike the SiGe layer, the SiGeC film displays only the dense band of defects at the surface (FIG. 5B(b)). A well-ordered array of misfit dislocations exists at the SiGeC/Si interface (FIG. 5B(d)). The array is of low density such that the misfits are not seen in a random TEM cross section (FIG. 5B(b)).

We now propose an explanation on the strain relaxation behavior shown in FIG. 5A. The TEM results (FIG. 5B) show that in addition to the interface defects which normally cause relaxation in SiGe/Si heteroepitaxy system, there are surface defects that can relieve the strain in the top part of epilayers. This non-uniform strain relaxation across the depth of epilayers can be seen from the slightly asymmetrical (004) peak and the broad peak together with the sharp peak in the (224) reflection (FIG. 1(d)). From the spacing of these misfit dislocations in SiGeC layers (FIG. 5B, (d)), the strain relaxation degree caused by interface defects is determined to be ~1%, consistent with the position of the sharp (224) peak observed in FIG. 5A(d). Thus the (004) peak shift in FIG. 5A (d) mostly comes from the additional strain relaxation, estimated to be ~12%, from the surface defects. Because of the similarity of the surface defects observed between SiGe and SiGeC layers, we can assume the same strain relaxation degree, ~12%, is caused by the surface defects. This is relatively small, compared to the overall strain relaxation, ~70% for the SiGe epilayer. The non-uniform strain relaxation along the depth in SiGe layers is thus not clearly resolved in our (004) and (224) reflections.

Figure 5C:
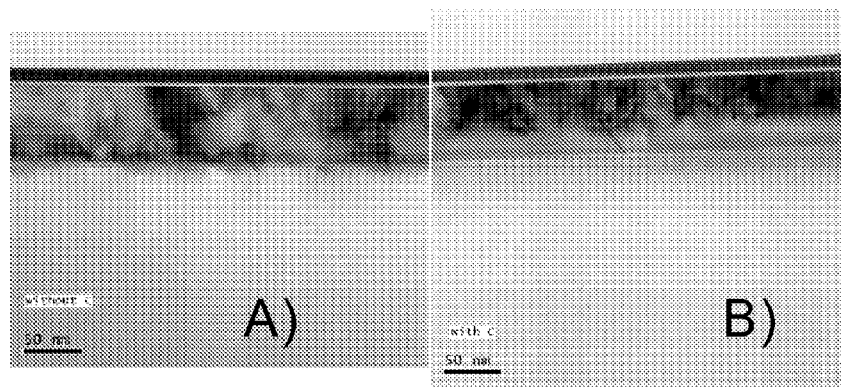
FIG. 5C contains cross-sectional TEM images of SiGe layers after As implantation and high temperature anneal for a) without and b) with C in-situ doping (invention's cell).

Very interesting, we found very similar results on the implant damage and strain relaxation in the SiGe and SiGeC layers for the more-damaging As implants. As can be seen from the TEM results shown in FIG. 5C, for SiGeC, there is a surface defective layer, which is thicker due to the deeper projected range for the implants. The interface again is clean without many defects, indicating small degree of strain relaxation at the interface, consistent with ||9% strain relaxation determined from XRD results (not shown). For the SiGe layer, however the film becomes quite defective across the depth. It seems the surface defect band is connected with the interface defect band, as observed in the B-implanted cases discussed earlier. The dense array of defects causes 85% strain relaxation in SiGe layer determined by XRD (not shown).

A hypothesis is that dislocation loops generated by implants in SiGe layer and Si substrate can move to SiGe/Si interface and form misfit dislocations, causing more strain relaxation than SiGe layer grown on Si without implants under the same thermal budget. This hypothesis is consistent with the high strain relaxation degree we observed here for implanted SiGe epi layers and with the fact that we found little strain relaxation for similar SiGe epi layers on Si with high temperature anneals alone. A small little amount of C has been shown to eliminate the EOR defects for implants in Si, which has been attributed to C atoms acting as Si interstitial sinks. A similar mechanism seems to be operating for epitaxial SiGe layers. The suppression of EOR defects inhibits the nucleation of misfit dislocation for such thin SiGe layer and thus prevents strain relaxation. Near the surface however the defects are still formed as in SiGe layer, which may be due to the inefficiency of Si interstitial sinks or too many displaced Si, because of the shallow implant conditions used.

In summary we have shown that for a 65 nm SiGe layer with ~25% Ge, conventional implants used for p-MOS S/D, halo and extension lead to significant implant damage and strain relaxation. Two defect bands are observed: one is close to the surface and the other is at SiGe/Si interface. Surface defects cause additional strain relaxation in the top part of the epi layers. In-situ C doping (1E19 to $1E20/cm^3$) is found to eliminate the implant damage close to SiGe/Si interface area and prevent significant strain relaxation.

B. Example 2-C Helps SiGe Retain Stress after Anneals

Figure 6B:
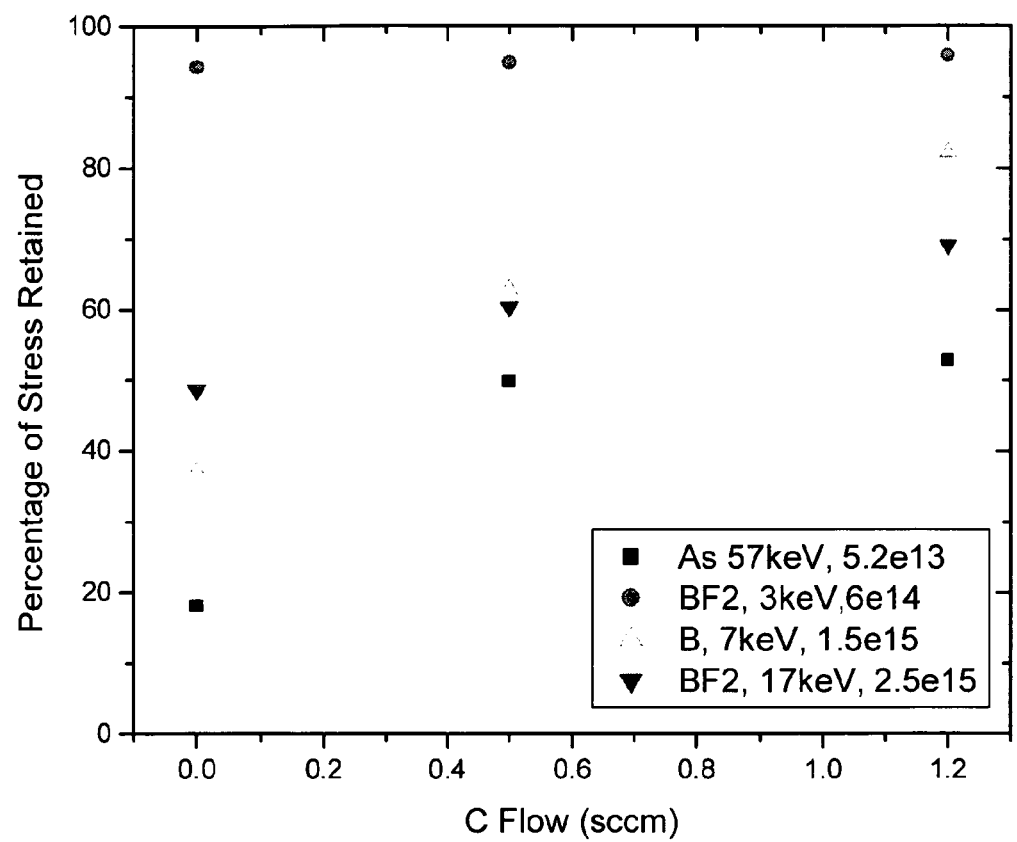
FIG. 6B is a graph of some results of an experiment involving the example embodiment's C doped SiGe layers.

Test wafers were prepared using the following flow:
Grow SiGe(C) epi with a C concentration about 1.5 atomic % (1E19 to $1E20/cm^3$)
Implant
RTA at T greater than 1000 C
(stress measurement done after each step)
FIG. 6A shows the results in tables 1, 2, 3 and 4.
FIG. 6B shows a graph of percentage of Stress retained vs C for the 4 I/i conditions.
Some conclusion that we can draw from FIG. 6A and FIG. 6B.
1) C helps SiGe retain stress for all 4 implant conditions
2) As implant gives the worst impact on stress loss followed by B S/D implant and then by BF2 implants.

3) It seems implant-induced damage is the major contributor to stress loss although film thickness may be slightly thicker than critical thickness.

CN=0.5 sccm is about C concentration in the SiGec layer of about 3E19 Atoms/cc

CN=1.2 sccm is about C concentration in the SiGec layer of about 7E19 Atoms/cc

C. Non-Limiting Example Embodiments

The example embodiments can be combined with other stress or strain inducing techniques such as stress memorization, dual stress layers (e.g, SiN capping stress layers). metal gates, STI stressors, etc.

Other configurations of gate structures are possible for all embodiments.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A device comprising:
a substrate having a device region;
a p-type transistor on the device region of the substrate, wherein the transistor comprises
  a gate,
  source and drain (S/D) regions adjacent to the gate, wherein a bottom of the S/D regions is disposed below a bottom of source-drain extension (SDE) regions, and
  a channel region under the gate between the S/D regions;
at least one recess in the substrate; and
a stressor region disposed in at least a portion of the recess in the substrate to apply a stress on the channel region, the stressor region comprises a carbon doped silicon germanium (SiGe) stressor layer having EOR defects, wherein a bottom of the stressor layer is disposed at least below the EOR defects, and wherein the carbon doped SiGe stressor layer comprises an amount of carbon which reduces the amount of EOR defects in order to reduce relaxation of the stress in the stressor layer.

2. The device of claim 1 wherein the at least one recess in the substrate comprises S/D recesses adjacent to the gate.

3. The device of claim 2 wherein the carbon doped SiGe layer is disposed in at least a portion of the S/D recesses adjacent to the gate.

4. The device of claim 3 further comprises S/D layers above the carbon doped SiGe layer in the S/D recesses.

5. The device of claim 2 wherein the stress comprises a compressive stress.

6. The device of claim 1 wherein the at least one recess comprises a first recess and the carbon doped SiGe layer completely occupies the first recess in the substrate.

7. The device of claim 6 wherein:
the stressor region is disposed under and spaced apart from the channel region; and comprising
a channel layer over the stressor region.

8. The device of claim 7 wherein the at least one recess comprises at least second and third recesses in the substrate, wherein the second and third recesses comprise S/D recesses adjacent to the gate.

9. The device of claim 1 wherein the amount of carbon in the carbon doped SiGe layer comprises about 0.1 to 0.2 atomic %.

10. The device of claim 1 wherein the bottom of the stressor layer is disposed completely below the EOR defects.

11. A device comprising:
a substrate having a device region;
at least one transistor on the device region of the substrate, wherein the at least one transistor comprises a p-type transistor, wherein the p-type transistor comprises
  a gate,
  source and drain (S/D) regions adjacent to the gate, wherein a bottom of the S/D regions is disposed below a bottom of source-drain extension (SDE) regions, and
  a channel region under the gate between the source and drain regions;
at least one recess disposed in the substrate; and
a stressor region disposed in at least a portion of the recess in the substrate to apply a stress on the channel region, the stressor region comprises a carbon doped silicon germanium (SiGe) stressor layer having EOR defects to form the S/D regions, and wherein a bottom of the stressor layer is disposed at least below the EOR defects.

12. A device comprising:
a substrate having a device region;
at least one transistor on the device region, wherein the at least one transistor comprises
  a gate, and
  diffusion regions adjacent to the gate, wherein a bottom of the diffusion regions is below a bottom of extension regions;
at least one recess disposed in at least a portion of the substrate; and
a stressor region in at least a portion of the recess to apply a stress on a desired region of the substrate, the stressor region comprises a carbon doped silicon germanium (SiGe) stressor layer having EOR defects, and wherein the carbon doped SiGe stressor layer comprises an amount of carbon to reduce the amount of EOR defects in order to reduce relaxation of the stress in the stressor layer and a bottom of the stressor layer is disposed at least below the EOR defects.

13. The device of claim 12 wherein the transistor comprises a channel region under the gate between the diffusion regions and the desired region comprises the channel region.

14. The device of claim 12 wherein the at least one recess in the substrate comprises S/D recesses adjacent to the gate.

15. The device of claim 14 wherein the at least one transistor comprises a p-type transistor.

16. The device of claim 12 wherein the amount of carbon in the stressor layer comprises about 0.1 to 0.2 atomic %.

17. The device of claim 12 further comprises at least one diffusion layer disposed above a top surface of the stressor layer, and wherein the transistor comprises a n-type transistor.

18. The device of claim 12 wherein the at least one recess comprises a first recess and the carbon doped SiGe layer completely occupies the first recess in the substrate.

19. The device of claim 18 wherein:
the stressor region is disposed under and spaced apart from the channel region; and comprising
a channel layer over the stressor region.

20. The device of claim 19 wherein the at least one recess comprises at least second and third recesses in the substrate, wherein the second and third recesses comprise S/D recesses adjacent to the gate.

* * * * *